United States Patent [19]

Authier et al.

[11] 4,131,659
[45] Dec. 26, 1978

[54] PROCESS FOR PRODUCING LARGE-SIZE, SELF-SUPPORTING PLATES OF SILICON

[75] Inventors: Bernhard Authier; Rudolf Griesshammer, both of Burghausen; Franz Köppl, Altötting; Winfried Lang, Burghausen; Erhard Sirtl, Marktl, Inn; Heinz-Jörg Rath, Burghausen, all of Fed. Rep. of Germany

[73] Assignee: Wacker-Chemitronic Gesellschaft für Elektronik-Grundstoffe mbH, Burghausen, Fed. Rep. of Germany

[21] Appl. No.: 743,268

[22] Filed: Nov. 19, 1976

[30] Foreign Application Priority Data

Aug. 25, 1976 [DE] Fed. Rep. of Germany ....... 2638270

[51] Int. Cl.² .......................................... H01L 21/205
[52] U.S. Cl. .......................................... 264/25; 264/27; 264/60; 264/81; 264/85; 423/348; 423/349; 427/86
[58] Field of Search ................ 264/81, 25, 60, 26, 264/27, 85, 327; 423/348-349; 427/86

[56] References Cited

U.S. PATENT DOCUMENTS

| | | | |
|---|---|---|---|
| 3,063,811 | 11/1962 | Kniepkamp et al. | 423/349 |
| 3,160,521 | 12/1964 | Ziegler et al. | 427/86 |
| 3,160,522 | 12/1964 | Heywang et al. | 423/349 |
| 3,549,411 | 12/1970 | Bean et al. | 264/81 |
| 3,565,674 | 2/1971 | Boland et al. | 264/81 |
| 3,900,540 | 8/1975 | Robba et al. | 264/81 |
| 3,969,163 | 7/1976 | Wakefield | 427/86 |
| 4,027,053 | 5/1977 | Lesk | 423/348 |

*Primary Examiner*—Jeffery R. Thurlow
*Attorney, Agent, or Firm*—Allison C. Collard; Thomas M. Galgano

[57] ABSTRACT

Process for producing large-size, self-supporting plates of silicon deposited from the gaseous phase on a substrate body, which comprises heating a graphite substrate to deposition temperature of silicon, which is deposited on the substrate from a gaseous compound to which a dopant has been added until a layer of about 200 to 650 μm has formed, subsequently melting 40-100% of this layer from the free surface downward, resolidifying the molten silicon by adjustment of a temperature gradient from the substrate body upward, and finally separating the silicon therefrom. The plates so formed are used primarily for making solar cells.

10 Claims, 1 Drawing Figure

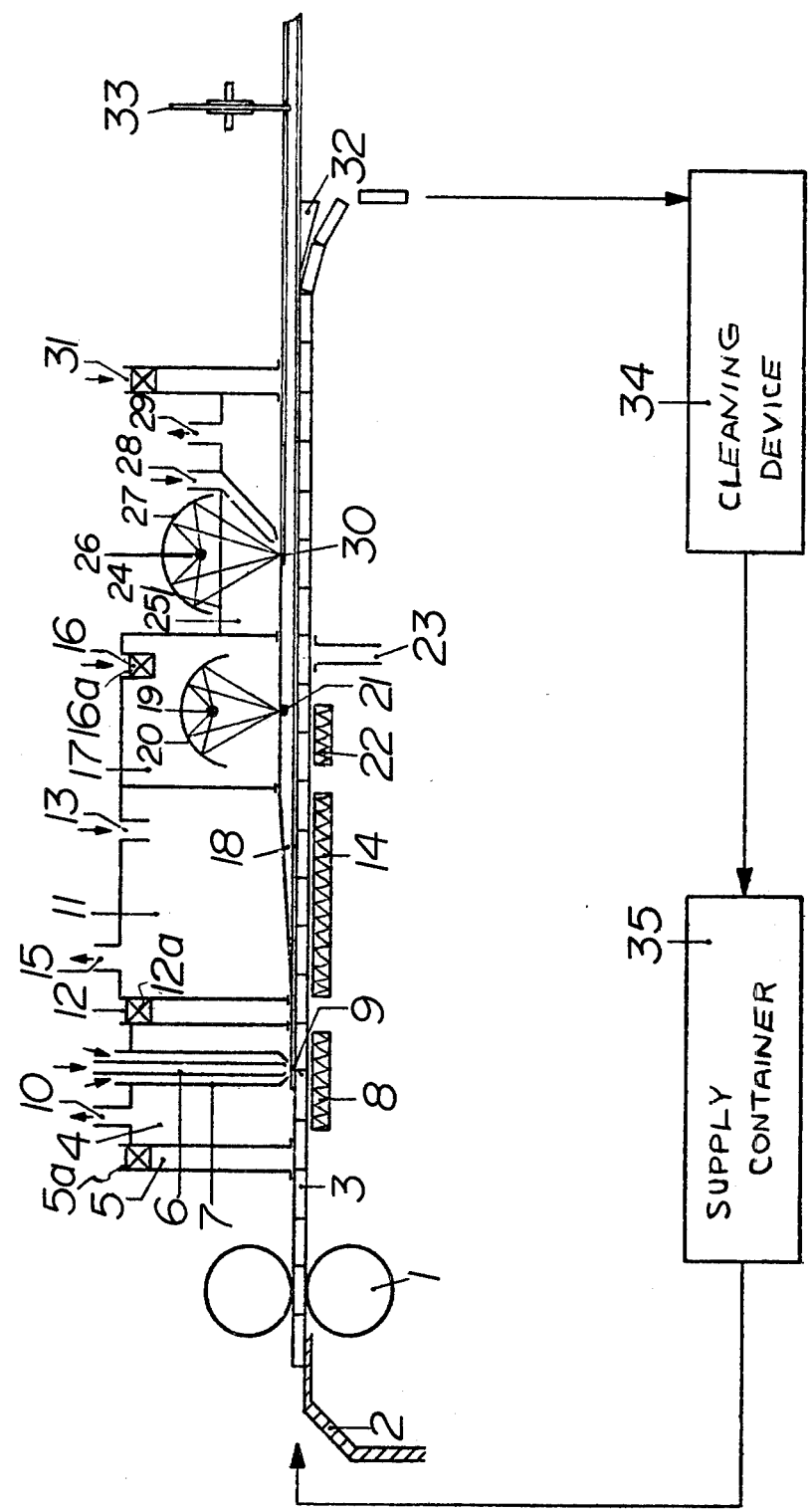

PROCESS FOR PRODUCING LARGE-SIZE, SELF-SUPPORTING PLATES OF SILICON

The present invention relates to a process for making large-size, self-supporting plates of silicon in which the latter is deposited from the gaseous phase on suitable substrate bodies.

Solar cells, such as used up to now in space travel as current generators, are much too expensive for large-scale terrestrial application. The production of solar cells from high-purity monocrystalline silicon rods cannot be considered for mass production, since the expenses for labor and construction in the processing of the rods, during which about 70% of the material is lost, are quite prohibitive.

That is the reason why, for some years now, attempts have been made to use cheaper, substantially polycrystalline silicon as basic material, though with the dismissal of monocrystalline material, the effectiveness of the solar cells made from other material has dropped considerably and amounts at the present to only a few per cent.

A first breakthrough to obtain cheaper, reasonably useful silicon material as basic material has been disclosed in DT-OS No. 25 08 803, according to which silicon is directly cast into thin plates under the influence of a temperature gradient. From this material, which has larger monocrystalline areas, solar cells having an efficiency of 5% can already be made.

According to investigations of T.L. Chu, solar cells may be made by depositing silicon from silane or trichlorosilane on small graphite discs in an epireactor. The maintenance of high substrate temperatures, low rates of deposition, and the composition of the gases used for deposition, determine substantially the efficiency of the solar cells made therefrom, which may be increased by a heat treatment of the deposited silicon, but even then reaches 5% at the most (see, *Journal of Electrochem. Society*, 1976, pages 106–110).

It is the object of the present invention to provide a process for producing solar cell material in which the expenses of labor and of the operations incurred for making ready to use solar cells from semiconductor base materials are reduced.

In accordance with the invention, this object can be accomplished by heating a graphite substrate body to deposition temperature of silicon which is deposited on the substrate from a gaseous compound to which a dopant has been added until a layer of 200 to 650 $\mu$m has formed, subsequently melting 40–100% of this layer from the free surface downward, resolidifying the molten silicon by adjustment of a suitable temperature gradient from the substrate body upward, and finally separating the silicon from the substrate.

As graphite substrate bodies, e.g., graphite foils are suitable which are made according to the producers from pure, well-ordered graphite in which by chemical and thermal treatment, the spacing of the layers in the crystal lattice of the graphite is extended to a multiple of the normal value of 3.35 A. The resulting bulk weight of the material, consisting of single, worm-shaped pieces, is then compressed on calenders or presses to obtain a denser final product, the layers of the graphite lattice being solidly united once more by mere mechanical pressure.

Very suitable furthermore are granite plates which, due to their pretreatment, are made anisotropic as regards the orientation of the graphite plates as parallel as possible with respect to the two oppositely placed largest boundary faces of the plate-shaped bodies. Only the two-dimensional preferred arrangement is of significance, since the orientation as regards the direction normal to the hexagonal planes of the graphite lattice is of no importance. As a consequence, especially preferred are graphite plates or other substrates, e.g., ceramics, into which a pyrographite layer has been applied since such pyrographite layers are deposited from the start in the desired preferred orientation by pyrolysis from mixtures of hydrocarbons having advantageously 1–10 carbon atoms and an inert gas or hydrogen, thus, for instance, from a methane-hydrogen mixture.

By this preferred orientation, the later separation of the deposited silicon plates from the hexagonal graphite planes is facilitated due to the easy cleavage of the graphite of these planes.

Before allowing the deposition of the silicon proper to take place, it may be advantageous to apply a thin intermediate layer, e.g., of 1–5 $\mu$m, the layer having insulating properties. This layer has the advantage that the graphite substrate body is not in direct contact with the silicon during its deposition and that the deposited silicon layer may later be easily separated. The intermediate layer also has a getter effect so that impurities rapidly diffusing during the cooling step will collect in the intermediate layer.

In general, materials for the intermediate layer are oxidic, nitridic, carbidic fine-grain to amorphous substances, e.g., amorphous silicon, silicon oxide, -carbide, or preferably silicon nitride.

The intermediate layer can be made, e.g., by simple brushing or spraying of suitable substances onto the substrate body or by pyrolytic decomposition, e.g., of silanes or silicic acid esters in the presence of oxygen, ammonia or suitable hydrocarbon compounds.

An intermediate layer of fine amorphous silicon can also be made quasi in situ during the deposition of the silicon directly on the untreated substrate body, namely, by leaving a few microns of the layer adjacent to the substrate unaffected by the subsequent process steps, thus neither melting them nor recrystallizing them.

The application of a nitride intermediate layer, which is a preferred mode of operating, may be done by covering the substrate with fine-grain silicon and subsequent nitration, though the preferred mode of operation is to produce the silicon nitride layer from the gas phase from the mixture of a silane or halogensilane with ammonia and by hydrogen in excess at temperatures of 750° C to 1100° C, preferably 950° C to 1050° C. For this operation, suitable gas mixtures would be monosilane/ammonia/hydrogen, or tetramethylsilane/ammonia/hydrogen. In the latter case, usually a mixed phase of silicon carbide-nitride is produced which is likewise useful as intermediate layer.

For the deposition of the silicon layer, the substrate body, with or without intermediate layer, is heated to the necessary deposition temperature which depends on the gas to be decomposed; generally, the temperature ranges from 800° to 1400° C, and in the preferred use of trichlorosilane + Hydrogen, to about 1000° to 1250° C.

As gases from which silicon is to be deposited, we mention, e.g., silicon hydride (monosilane), monochlorosilane, dichloro-trichloro-tetrachlorosilanes and hexachlorodisilane alone or in mixture with, if necessary, with addition of hydrogen or inert gases, such as argon or helium.

Already during the deposition, dopants are added to the deposition gas, for instance, phosphorus, arsenic or antimony, which cause n-conduction, or preferably boron, aluminum-gallium- or indium compounds which result in p-conduction.

The deposition is discontinued after the desired layer thickness is obtained in each case, about 200 to 650 μm, preferably 300 to 500 μm, whereupon 40 to 100% of the silicon layer is melted from the surface down.

The melting of the silicon layer is effected advantageously by energy input from the substrate body and simultaneously by heating lamps arranged above the surface of the silicon layer.

Preferably, the main load of the required energy is provided by heating of the substrate body, so that the amount of energy needed for the melting of the silicon layer from the top down by heat sources arranged above the silicon layer will be minimized. This permits the use of inexpensive, commercially available heating lamps. In this embodiment of the invention, the substrate body, e.g., the graphite foil, is heated to such a degree by direct current passage that the adjacent silicon layer is brought up to, e.g., 1000°–1250° C. The additional heat required to heat silicon to the melting temperature of 1410° C is easily provided by conventional heating lamps radiating upon the surface of the silicon layer.

The graphite substrate body can, of course, be heated by contact heating via the deposit, or by heating the silicon layer with a suitable induction heating coil in which case the heating of the substrate body is not necessarily required.

In case there is no insulating intermediate layer applied to the substrate body before silicon is deposited, there is the possibility of melting the silicon layer by a glow discharge under normal pressure in an atmosphere of hydrogen or an inert gas atmosphere containing at least a substantial amount of hydrogen; this is done by connecting the electrically conductive substrate as cathode and moving a metal strap or bracket connected as, anode, in a suitable distance over the silicon surface. This mode of operation is, however, only applicable when the entire silicon surface is to be melted down to the substrate body. A separate substrate heating is in this case, of course, dispensable.

The liquid silicon layer or the melted portion of the silicon layer is subsequently brought to controlled resolidification, by adjusting a vertical gradient extending from the substrate body to the surface of the silicon layer, causing the temperature level to drop below the melting point of the silicon. This may be done, e.g., by slowly decreasing the electrically controlled substrate heating which results in a solidification of the silicon layer from the substrate body toward the free surface if the lamps alone are not sufficient to keep the silicon layer in molten state.

The solidification process can, of course, be shortened by reducing the radiation energy of the lamps, and this in such a manner that within the liquid silicon layer, a vertically directed temperature gradient becomes adjusted amounting to about 30°–100° C. Furthermore, a more rapid cooling of the substrate body can be achieved by passing a cooling gas, e.g., argon, along.

According to the preferred mode of operation, a pn-transition is formed in the surface of the silicon layer in a subsequent step by again melting the remelted silicon layer at the surface and introducing into that molten layer a dopant which dopes silicon oppositely as compared to the dopants in the adjacent silicon layer. When, for instance, the silicon layer was p-doped, so much phosphorus, arsenic or antimony would be added to the surface remelted for the second time as is required for making the last-mentioned layer n-conductive.

Yet another possibility consists of letting the molten silicon layer resolidify only until a thin liquid surface film remains and allowing an appropriate dopant to enter that film by diffusion. Instead of melting the surface of the silicon layer to, for instance, 0.3–1.5 μm in order to introduce the required dopant from the gas phase, thus pass phosphine, in the case of phosphorus, into the layer, it is also possible to brush an appropriate dopant onto the solid surface of the silicon layer and to allow it to diffuse superficially into the silicon layer by heat application. Finally, there is the possibility of introducing the dopants by ion implantation into the solid surface of the silicon layer.

After cooling to room temperature, the substrate body is separated from the deposited silicon. The separation may be brought about by mechanical means, for instance, by lifting off the silicon layer from the substrate body with a thin cutting device. The bond between the silicon layer and the substrate is loosened anyway by the cooling operation and the special structure of the graphite surface, particularly when an insulating intermediate layer was applied, so that the separation will not present any difficulties. Before the graphite substrate is used again, it is desirable to remove any remnants of the intermediate layer by a suitable brush or by sand blasting. Instead of by the dry cleaning mentioned, remnants may also be removed with a solvent.

It is advantageous to use the graphite foil or other substrate body in the form of an endless band, the substrate surface freed after removal of the deposited silicon layer being newly covered again and again. Also, when using graphite plates, such a continuous process can be advantageously carried out in such a manner that the plates travel through the deposition apparatus in the sequence depositing, recrystallizing, separating, cleaning, and depositing. When the process is not carried out continuously but the deposition is made to occur on a very thin graphite foil, this can be removed simply by sand blasting.

It is preferred to carry out the process continuously as shown in the following description of the accompanying drawing which is a schematic illustration.

A suitable drive means, e.g., a set of rollers 1 advances a steel plate 2 extending through the entire apparatus; on the plate 2, a plurality of individual, abutting graphite plates 3, preferably of pyrographite nature, are continuously travelling through the device at a rate of 1–15 cm per minute, preferably 3–7 cm/min. Steel plate 2, or a similarly dimensioned ceramic or quartzplate, which is sectionally and selectively heatable from below by a resistance heating comprising coils or tubes, has the same width as the graphite plates 3 and is equipped with a butt edge, so that the plates 3 are propelled through the apparatus with the formation of a continuous band-shaped deposition surface. The width of plates 3 depends on the dimensioning of the apparatus and corresponds substantially to the width of the deposition chambers minus the wall thickness. Advantageous sizes are about 5–20 cm for the width, as well as 5–20 cm for the length, and 0.1–1 cm for the height, having a parallelogram-shaped, preferably square-shaped, cross-section in the direction of movement.

In addition to the described mode of operation, the graphite plates may be placed on a conveyor belt which is sectionally heatable to different temperatures and moved through the apparatus thereon. Yet, another possibility is to transport the abutting plates while they glide over two guide rails, the heating being brought about by direct passage of current, or contact-free by heating elements of ceramic or quartz arranged below the plates.

Before entering the first deposition chamber 4, the graphite plates 3 pass through a gas trap 5 provided with a pressure-maintaining valve 5a where they are circulated by an inert gas, e.g., argon, under a pressure of 0.1–0.3 bar above the pressure of the first chamber 4. This arrangement avoids the possibility that reactive gases from chamber 4 could escape to the outside or that air from the outside enters chamber 4. In that chamber, the plates are met by a gas mixture blown through a narrow double tube, the inner tube 6 admitting, e.g., monosilane, advantageously in an amount of about 300–400 parts by volume of hydrogen, and the outer tube admitting ammonia, either undiluted or likewise, preferably in 400 parts by volume of hydrogen. The molar ratio calculated on the components monosilane : ammonia being preferably 1 : 2 – 1 : 4.

The gas mixture is blown out of the narrow slit-shaped double tube whose width corresponds substantially to the clear width of the chamber 4 and which extends with its gas outlet opening to about 0.5–3 cm, preferably 1–2 cm, above the surface of the graphite substrate at a pressure of 1–2 bar, preferably 1.1–1.4 bar; the rate at which the gas passes is adjusted in such a manner that an intermediate layer of silicon nitride 9 is deposited on the plates in a thickness of 1–5, preferably 1.5–3 $\mu$m; while the plates pass through chamber 4, the temperature of the plates is raised to about 750° to 1200° C, preferably 950° to 1050° C, by heating device 8. Reaction gases escape from chamber 4 through exhaust tube 10.

After the first deposition chamber 4 which is only required when the formation of an intermediate layer between the substrate body and the silicon layer is intended — the band of graphite plates 3 passes a gas trap 12 with a pressure-maintaining valve 12a; there, an inert gas, especially argon, is blown at a pressure of 0.1–0.3 bar above the pressure of the two adjacent chambers 4 and 11, which are preferably maintained at an almost equal pressure, onto the surface of the intermediately coated band of graphite plates 3, in order to prevent the reaction and decomposition gases from escaping from the two chambers.

Chamber 11 is the large deposition chamber where the deposition of silicon on the substrate is taking place. The gas for the deposition is admitted through tube 13. It consists of a mixture of, e.g., about 80–95 parts by volume of hydrogen and about 5–20 parts by volume of, for instance, trichlorosilane, the total, of course, adding up to 100% by volume. To this is added an amount of about 50–100 ppm diborane in hydrogen. Altogether, the amount of dopant added should be so calculated that in the deposition gas, an atomic ratio of boron:silicon will be 1:$10^5$ to 1:$10^7$. The size of the gas admitting tube 13 is not critical, provided only its sectional area permits the introduction of 1–2 bar, preferably 1.1–1.4 bar, in such an amount that during the passage of plates 3 through the large deposition chamber 11, doped silicon will be deposited in a thickness of 200–650 $\mu$m, preperably 300–500 $\mu$m, the deposition occurring on the plates while they are heated up to 1000°–1250° C, preferably 1050°–1150° C by heating means 14. The reaction gases and unreacted deposition gases escape through a tube 15 from chamber 11.

After leaving the deposition chamber 11, the coated graphite plates 3 enter a recrystallization chamber 17 which is filled with inert gas, e.g., argon, by means of a tube 16 having a pressure-maintaining valve 16a, the pressure being higher by 0.1–0.3 bar as compared to the one obtained in chamber 11. In chamber 17, a halogen rod-containing lamp 19 extending over the entire width of the band of plates 3 is mounted, wherein a reflector 20 having an elliptical curvature focuses radiation, preferably on a small area over the width of the band, whereby 40–100% of the thickness of the silicon layer 18 is melted. The basic load of the energy supply is furnished through the substrate body, namely, by heating the band by heating device 22, raising the temperature to about 1150°–1250° C. By a gas admission tube 23 provided below the band of graphite plates, an inert gas, e.g., argon of room temperature, thus, about 25° C, is blown as coolant onto the band, thereby dissipating the heat of crystallization and causing an oriented growth of the resolidifying silicon from the substrate body toward the free surface.

Next, the band of graphite plates leaving recrystallization chamber 17 with the resolidified silicon layer 18 thereon, or as the case may be, also carrying the intermediate layer 9, enters a doping chamber 25 covered by a quartz plate 24. Above the quartz plate, a lamp 26 having a halogen rod is arranged, and above the lamp an elliptically curved reflector 27, which superficially melts the resolidified silicon layer 18 to a depth of 0.5–3 $\mu$m, and a dopant is admitted having opposite polarity to the one already present in the silicon layer. The dopant is introduced by a gas inlet tube 28 extending to about 0.5–3 cm, preferably 1–2 cm, toward the remelted area of the silicon layer. A suitable dopant is, e.g., phosphine, which is admitted in the amount of 50–100 ppm in hydrogen. This dopant has to be introduced in a quantity which will not only compensate the previously present dopant, but must provide one phosphorus atom for $10^3$ to $10^7$ silicon atoms. The reaction and residual gases are withdrawn through tube 29. The silicon layer 30 remelted to a width of 1–2 mm absorbs phosphorus from the decomposition of the phosphine with formation of a pn-transition to the adjacent silicon layer 18.

After having passed a gas trap 31 which is similarly built to traps 5 and 12, the deposited silicon layer is lifted off the graphite plates 3 with a sharp spatula 32 and is cut into individual plates with a cutting device 33, preferably along the seams of the substrate plates. The graphite plates are then superficially cleaned with steel brushes or by sand blasting in a cleaning device 34, added to with new graphite plates from the supply container 35 and returned for new deposition to the apparatus.

The large self-supporting silicon plates made according to the invention, particularly provided with a pn-transition, are used primarily as solar cells which are distinguished by the length of the useful life of the minority carriers. The effectiveness of these solar cells is up to 10% which proves the economy of the process according to the invention. This can be considered as an important step in the large-scale technical use of solar energy.

The process will now be more fully explained in a specific example which is given by way of illustration and not of limitation.

EXAMPLE

A band consisting of pyrographite-coated graphite plates, each being 10 cm wide, 10 cm long, and 1 cm thick and having a square cross-section in the direction of movement, is passed through the deposition apparatus by a pair of rollers driven along two guide rails by an electromotor at a rate of 5 cm/min. The gas pressure in both deposition chambers is 1.2 bar, the argon pressure in the three gas traps and in the recrystallization chamber is 1.3 bar.

As the band of graphite plates passes through the first deposition chamber, having a length of 15 cm, a silicon nitride layer of 1 $\mu$m is deposited thereon. This is effected by pyrolytic decomposition of a mixture of monosilane in 300 parts by volume of hydrogen and of ammonia, likewise in 300 parts by volume of hydrogen, emerging from a nozzle arranged at 2 cm above the band of graphite plates which is being heated to 1000° C by resistance heating provided below the plates; the molar ratio of mono-silane-ammonia is 1:3. The gas passes through at the rate of 150 normal liters per hour.

In the second deposition chamber which has a length of 100 cm, a silicon layer of 400 $\mu$m is deposited on the graphite plates with their intermediate layer, the plates having a temperature of 1150° C. The deposition is brought about by the decomposition of a mixture containing 7% of saturated gas with 93 volume % hydrogen and 7% volume % trichlorosilane to which a dopant gas consisting of hydrogen and 100 ppm diborane has been added in such an amount that the deposition gas contains a total of 0.5 ppm diborane, the mixture passing over the graphite band at a rate of 1000 normal liters/hour.

Subsequently, the temperature of the plates is raised to 1250° C and by means of the described lamp having a halogen rod and an elliptical reflector, a narrow zone of 1 mm is melted over the entire width of the band of plates, the depth of the zone reaching down to the intermediate layer. The zone is then resolidified by blowing argon of room temperature onto the band from below.

The resolidified silicon layer is then once more melted by a second lamp with halogen rod and reflector, the remelting being only effected superficially for a depth of about 1 $\mu$m and a pn-transition is obtained by incorporation of phosphorus derived by decomposition of a doping gas consisting of hydrogen with 100 ppm phosphine. Subsequently, the deposited silicon layer is separated from the substrate body by means of a spatula of stainless steel.

The self-supporting silicon layer is cut with a diamond saw following the seams of the substrate plates into plates having a length of 10 cm, and residual particles of the intermediate layer, if present, are sandblasted away.

When the plates are appropriately connected, they have an effectiveness of 6–8%.

From the foregoing description, one skilled in the art can easily ascertain the essential characteristics of this invention, and without departing from the spirit and scope thereof, can make various changes and modifications of the invention to adapt it to various usages and conditions. Consequently, such changes and modifications are properly, equitably, and intended to be, within the full range of equivalence of the following claims.

What is claimed is:

1. A process for producing large-size, self-supporting plates of silicon deposited from the gaseous phase on a substrate body, comprising the steps of:
   heating a graphite substrate to the decomposition temperature of silicon;
   depositing silicon from a gaseous compound to which a dopant of a first conductivity has been added, upon said substrate, in solid form until a layer of about 200 to 600 $\mu$m has formed;
   subsequently melting 40–100% of said layer from the free surface downward;
   resolidifying the molten silicon from the substrate body upwardly to the free surface of the molten silicon layer to effect an oriented growth of the resolidifying silicon from the substrate toward the free surface, said resolidifying step being effected by maintaining a vertically directed temperature gradient between the lower surface and the free surface of said molten layer until said molten layer is completely resolidified; and
   finally separating the silicon from said substrate.

2. The process according to claim 1, wherein an intermediate layer is applied to the substrate body before the silicon is deposited, said intermediate layer remaining adhered to said substrate body following separation of said silicon therefrom.

3. The process according to claim 2 wherein silicon nitride is applied as said intermediate layer.

4. The process according to claim 1 wherein the gaseous compound from which silicon is deposited is a mixture of trichlorosilane and hydrogen.

5. The process according to claim 1 wherein the dopant added to the gaseous compound is one which leads to a p-conduction.

6. The process according to claim 1 wherein the deposited silicon is melted by a radiation source mounted above the same.

7. The process according to claim 1 wherein the main energy supply for the melting is delivered by heating up the substrate body.

8. The process according to claim 1, wherein the resolidified silicon surface is melted once more to a depth of 0.5 to 1.5 $\mu$m in the presence of a volatile dopant of an opposite conductivity relative to said first dopant which causes the remelted silicon to become doped in opposite conductivity relative to the adjacent silicon layer.

9. The process according to claim 1 wherein the substrate body is continuously reintroduced into the process after the silicon layer has been removed therefrom.

10. The process according to claim 1 wherein the self-supporting silicon layer is cut into plates to be used as solar cells.

* * * * *